United States Patent
Cojocaru et al.

(10) Patent No.: US 9,261,538 B2
(45) Date of Patent: Feb. 16, 2016

(54) ISOLATING INTERCHIP COMMUNICATION CIRCUIT AND METHOD

(71) Applicants: Christain Cojocaru, Ottawa (CA); Igor Miletic, Ottawa (CA); Gerald Augustoni, Ottawa (CA)

(72) Inventors: Christain Cojocaru, Ottawa (CA); Igor Miletic, Ottawa (CA); Gerald Augustoni, Ottawa (CA)

(73) Assignee: Solantro Semiconductor Corp., Ottawa (CA)

( * ) Notice: Subject to any disclaimer, the term of this patent is extended or adjusted under 35 U.S.C. 154(b) by 0 days.

(21) Appl. No.: 14/298,187

(22) Filed: Jun. 6, 2014

(65) Prior Publication Data
US 2015/0355239 A1    Dec. 10, 2015

(51) Int. Cl.
*G01R 15/14*    (2006.01)
(52) U.S. Cl.
CPC ..................... *G01R 15/14* (2013.01)
(58) Field of Classification Search
CPC ........................................ G01R 15/14
See application file for complete search history.

(56) References Cited

U.S. PATENT DOCUMENTS

| | | | |
|---|---|---|---|
| 7,362,086 B2 | 4/2008 | Dupuis et al. | |
| 7,421,028 B2 | 9/2008 | Dupuis | |
| 7,447,492 B2 | 11/2008 | Dupuis | |
| 7,468,547 B2 | 12/2008 | Harvey | |
| 2003/0025957 A1* | 2/2003 | Jayakumar | H04B 10/00 398/5 |

* cited by examiner

*Primary Examiner* — Daniel Puentes
(74) *Attorney, Agent, or Firm* — Rahman LLC

(57) ABSTRACT

An electrical circuit and method includes a transmitter in a first power domain with a first supply voltage referenced to a first voltage reference. The transmitter has an oscillator generating a first carrier signal, and an analog modulator receiving an input sensor signal and the first carrier signal and generating a modulated carrier signal. A receiver is in a second power domain with a second supply voltage referenced to a second voltage reference. The second voltage reference is different from the first voltage reference. The receiver includes a demodulator that receives and demodulates the modulated carrier signal and generates an output sensor signal. At least one coupler includes a pair of galvanically isolated elements with one galvanically isolated element in each of the first and second power domains. The modulated carrier signal couples from the first power domain to the second power domain through the at least one coupler.

23 Claims, 14 Drawing Sheets

ISOLATING INTERCHIP COMMUNICATION CIRCUIT AND METHOD

BACKGROUND

1. Technical Field

The embodiments herein generally relate to electrical circuits, and more particularly to communication circuits for power technology.

2. Description of the Related Art

Within electronic devices, such as, for example power supplies or inverters, there is often a requirement to measure a parameter in a first power domain within the device and pass the measurement to a second power domain within the device. The measurement could be for example, a current, a voltage or a phase. The measurement could be used as a control variable to control circuitry within the second power domain. A power domain is characterized as a collection of circuits operated from a common voltage supply. Different power domains have different voltage supplies. Power domains could be galvanically isolated from one another in which case they also do not share a common power return or ground. Thus, if a voltage or signal from a first power domain were applied to a load in another galvanically isolated power domain, no current would flow since there is no return path to carry the current back to the originating (first) power domain. There could also be a requirement to make an isolated measurement within an electronic device.

SUMMARY

In view of the foregoing, an embodiment herein provides an electrical circuit comprising a transmitter in a first power domain with a first supply voltage referenced to a first voltage reference, the transmitter comprising a first oscillator generating a first carrier signal; and an analog modulator receiving an input sensor signal and the first carrier signal and generating a modulated carrier signal. The electrical circuit further comprises a receiver in a second power domain with a second supply voltage referenced to a second voltage reference, wherein the second voltage reference is different from the first voltage reference, wherein the receiver comprises a demodulator that receives and demodulates the modulated carrier signal and generates an output sensor signal; and at least one coupler comprising a pair of galvanically isolated elements with one galvanically isolated element in each of the first power domain and the second power domain, wherein the modulated carrier signal couples from the first power domain to the second power domain through the at least one coupler. The demodulator may receive a second carrier signal. The electrical circuit may further comprise a sensor that takes measurements and generates the input sensor signal.

The first oscillator may comprise a free running oscillator. The pair of galvanically isolated elements may be inductively coupled together. Alternatively, the pair of galvanically isolated elements may be capacitively coupled together. The demodulator may comprise an analog demodulator. Alternatively, the demodulator may comprise a digital demodulator. The at least one coupler may comprise a transformer. Alternatively, the at least one coupler may comprise a capacitor. The electrical circuit may further comprise a second oscillator in the receiver that generates the second carrier signal. The electrical circuit may further comprise a second coupler comprising a second pair of galvanically isolated elements with one galvanically isolated element of the second coupler in each of the first power domain and the second power domain, wherein the first carrier signal passes from the first power domain to the second power domain through the second coupler unmodulated. The first oscillator may comprise one of the galvanically isolated elements of the at least one coupler. The electrical circuit may comprise a single electronic package, the transmitter comprises a first semiconductor die, and the receiver comprises a second semiconductor die.

Another embodiment provides an electrical circuit comprising a transmitter in a first power domain with a first supply voltage referenced to a first voltage reference, the transmitter providing a modulated carrier signal and an unmodulated carrier signal; a receiver in a second power domain with a second supply voltage referenced to a second voltage reference, wherein the second voltage reference is different from the first voltage reference, wherein the receiver comprises a demodulator that receives and demodulates the modulated carrier signal and generates an output sensor signal; and at least one coupler comprising a pair of galvanically isolated elements with one galvanically isolated element in each of the first power domain and the second power domain, wherein the modulated carrier signal couples from the first power domain to the second power domain through the at least one coupler.

The transmitter may comprises an oscillator that generates a first unmodulated carrier signal; a phase delay element that generates a second unmodulated carrier signal; a baseband generator that generates modulation signals; a first mixer that adds a first modulation signal from the baseband generator to the first unmodulated carrier signal to create a first modulated carrier signal; a second mixer that adds a second modulation signal from the baseband generator to the second unmodulated carrier signal to create a second modulated carrier signal; and a summing circuit that sums the first modulated carrier signal with the second modulated carrier signal to generate the modulated carrier signal that couples through the at least one coupler. The modulation signals may comprise in-phase and quadrature phase modulation signals. The receiver may comprise an oscillator that generates an in-phase carrier signal; a phase delay element that generates a quadrature phase carrier signal; a first mixer that adds the modulated carrier signal with the in-phase carrier signal; a second mixer that adds the modulated carrier signal with the quadrature phase carrier signal; a first filter that filters an output of the first mixer; and a second filter that filters an output of the second mixer, wherein the first filter and the second filter output a recovered version of the first modulation signal and the second modulation signal for input into the demodulator.

The electrical circuit may further comprise a second coupler comprising a second pair of galvanically isolated elements with one galvanically isolated element in each of the first power domain and the second power domain, wherein the unmodulated carrier signal couples from the first power domain to the second power domain through the second coupler. The receiver may comprise a first mixer that adds the unmodulated carrier signal with the modulated carrier signal; and a phase delay element that receives the unmodulated carrier signal and generates a quadrature phase unmodulated carrier signal; a second mixer that adds the quadrature phase unmodulated carrier signal with the modulated carrier signal; a first filter that filters an output of the first mixer; and a second filter that filters an output of the second mixer, wherein the first filter and the second filter output a recovered version of a first and second modulation signal for input into the demodulator.

Another embodiment provides a method of sending signals between power domains, the method comprising generating a first carrier signal in a first power domain with a first supply voltage referenced to a first voltage reference; generating an analog modulated carrier signal from an input sensor signal and the first carrier signal in the first power domain; transmitting the modulated carrier signal through at least one coupler coupling the first power domain to a second power domain with a second supply voltage referenced to a second voltage reference, wherein the second voltage reference is different from the first voltage reference, and wherein the at least one coupler comprises a pair of galvanically isolated elements with one galvanically isolated element in each of the first power domain and the second power domain; and demodulating the modulated carrier signal to generate an output sensor signal. The method may further comprise inductively coupling together the pair of galvanically isolated elements. The method may further comprise providing a plurality of couplers each comprising a pair of galvanically isolated elements with one galvanically isolated element of each coupler in each of the first power domain and the second power domain; and transmitting an unmodulated carrier signal from the first power domain to the second power domain through at least one of the plurality of couplers.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Figure 1:
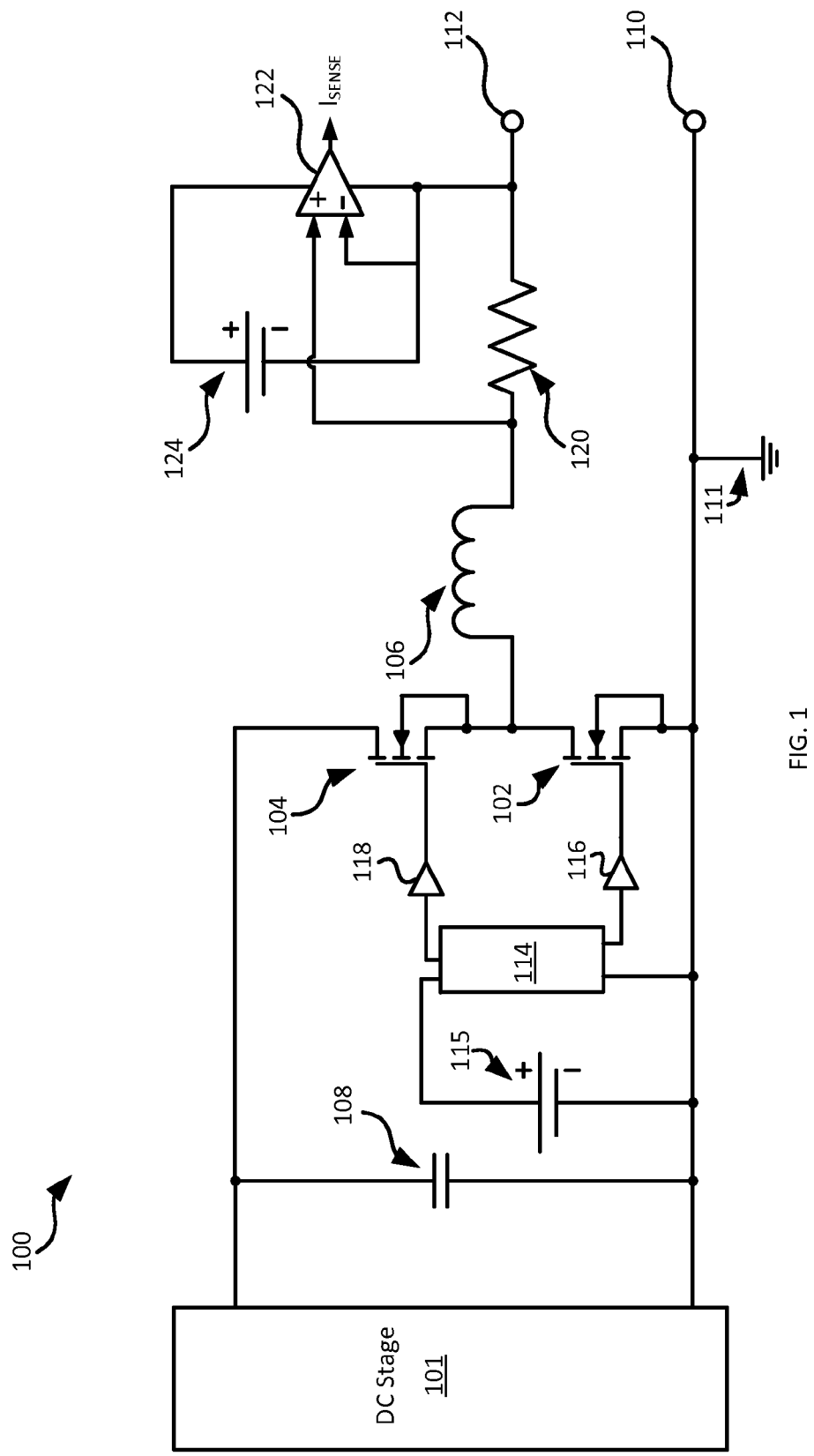
FIG. 1 is a circuit diagram illustrating an example switching mode AC power supply according to an embodiment herein.

Referring now to the drawings, and more particularly to FIGS. 1 through 9, where similar reference characters denote corresponding features consistently throughout the figures, there are shown preferred embodiments. FIG. 1 is a circuit diagram of an example switching mode AC power supply 100. AC power supply 100 comprises high side transistor 104, low side driver transistor 102, inductor 106, sense resistor 120, amplifier 122, amplifier power supply 124, DC link capacitor 108, high side driver 118, low side driver 116, controller 114 and DC stage 101. High and low side transistors 104, 102 are alternately driven by high and low side drivers 118, 116, respectively, to produce an AC voltage at output terminal 112 with its voltage reference as neutral terminal 110. Neutral terminal 110 is connected to the system ground 111. Switch controller 114 controls the ON and OFF state of transistors 102 and 104 through drivers 116, 118, respectively. Switch controller 114 is supplied by power supply 115, which is referenced to system ground 111. Transistors 102, 104 are supplied with DC power by DC stage 101. DC link capacitor 108 provides filtering and energy storage. The detailed circuitry of DC stage 101 has not been shown for simplicity of illustration.

Sense resistor 120 is used to sense the output current of AC power supply 100. The output current could be a useful measurement with which to control DC stage 101. A sense voltage is developed across sense resistor 120 by any output current passing it. Amplifier 122 amplifies the voltage developed across sense resistor 120 for further processing. It is advantageous to make sense resistor 120 small; e.g., in the milli-ohm range, to prevent significant power loss and heating. The sense voltage could be much smaller than the output voltage across terminal pair 120. For example, AC power supply 100 might have an RMS output voltage and current of 240 V and 1 A, respectively. Sense resistor 120 could have a value of 50 milli-ohms in which case the voltage developed across it would be 50 milli-Volts. For accurate sensing of this voltage it could be advantageous to amplify the voltage using amplifier 122 and to power the amplifier 122 from a separate, floating power supply such as amplifier supply 124. Amplifier supply 124 is "floating" and its voltage reference is to output terminal 112 rather than to neutral terminal 110. For an RMS output voltage of 240V, the circuitry of amplifier 122 could be as much as 339 V above or below system ground 111 depending on the phase of the AC output voltage at terminal pair 112. The output of amplifier 122 cannot therefore be directly interfaced to the control circuitry of AC supply 102 such as switch controller 114 due to this large and variable voltage difference. An isolating communication scheme is required to pass the current measurement from amplifier 122 in the "high side" power domain of AC supply 100 to the remaining control circuitry of AC supply 100 in the "low side" power domain.

Figure 2A:
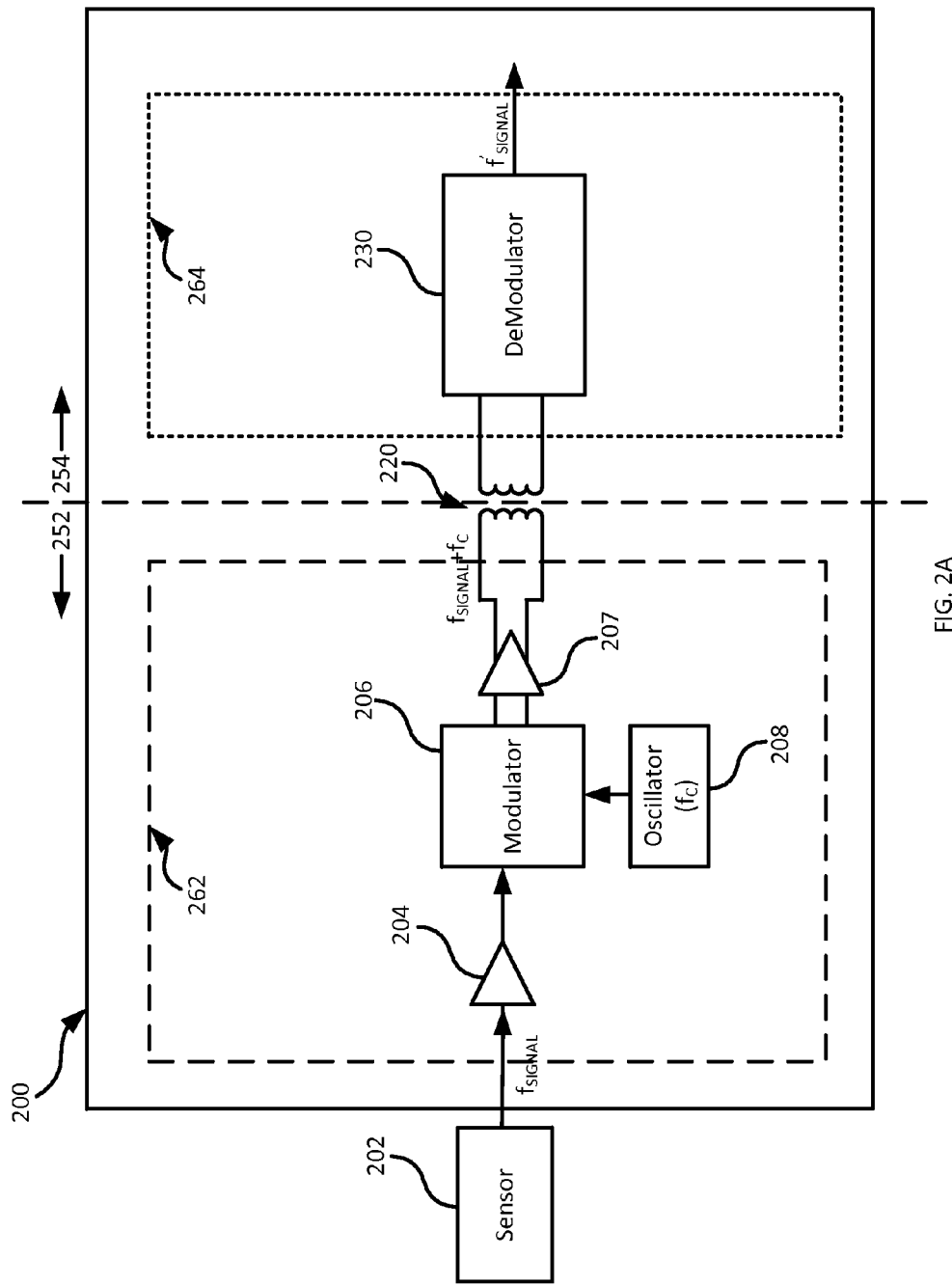
FIG. 2A is a circuit diagram illustrating an isolating communication circuit suitable for cross power domain communications and isolated sensing according to an embodiment herein.

FIG. 2A, with reference to FIG. 1, is a circuit diagram of an isolating communication circuit 200 suitable for cross power domain communications and isolated sensing. Isolating communication circuit 200 comprises transmitter 262, receiver 264, and transformer 220. Transmitter 262 is in power domain 252 and receiver 264 is in power domain 254. Transformer 220 comprises two galvanically isolated windings and spans high side power domain 252 and low side power domain 254 with a winding in each power domain. Galvanic isolation means there is no direct current (DC) path between the elements and that conduction between the elements at DC is insignificant. Transmitter 262 comprises analog front end (AFE) 204, analog modulator 206, oscillator 208, and power amplifier 207. Receiver 264 comprises demodulator 230.

Isolating communication circuit 200 communicates measurements taken by sensor 202 in high side power domain 252 to low side power domain 254. Sensor 202 outputs sensor signal $f_{SIGNAL}$ to AFE 204, which processes the signal and passes it to analog modulator 206. AFE 204 performs signal conditioning which could include, for example amplification, filtering, or common mode rejection. AFE 204 could have a single input or a differential input. In some embodiments, sensor 202 could output a sufficiently strong and well behaved signal such that no signal conditioning is required and in this case AFE 204 could be unnecessary. In other embodiments, AFE 204 could also be incorporated into analog modulator 206. Sensor signal $f_{SIGNAL}$ is an analog signal and could assume a continuous range of values across the output range of sensor 202. Analog modulator 206 also receives a carrier signal of frequency $f_C$ and constant amplitude from oscillator 208. Oscillator 208 could be a free running oscillator or could be derived from a crystal oscillator.

Modulator 206 modulates the carrier signal with the sensor signal and the modulated carrier signal ($f_{SIGNAL}+f_C$) is output to power amplifier 207. Power amplifier 207 amplifies the modulated carrier signal sufficiently so that it may drive transformer 220. Transformer 220 has two windings and spans power domains 252, 254 with one winding in each power domain. To facilitate integration with a silicon die, transformer 220 could be designed to operate in the radio frequency range (hundreds of MHz to GHz) and oscillator 208 could provide a carrier signal in that frequency range.

The windings of transformer 220 are galvanically isolated from one another but inductively coupled together such that a signal in one winding will induce a signal of similar frequency in the other winding. The voltage of the induced signal depends on the transformer turns ratio and the coupling between the transformers windings. In one embodiment, the turns ratio is 1:1 and the coupling ratio is 0.3. The level of galvanic isolation between the windings of transformer 220 should be sufficient to withstand the maximum voltage difference between high and low side power domains 252, 254. For the current sensor of FIG. 1 this could be at least as great as the peak amplitude of the output voltage of AC power supply 100. The modulated carrier signal passes through transformer 220 and into demodulator 230.

Demodulator 230 demodulates the modulated carrier signal and outputs sensor signal $f'_{SIGNAL}$. In an ideal communication scheme there is no difference between $f_{SIGNAL}$ and $f'_{SIGNAL}$ created by the modulation/demodulation operations. Any difference between the two signals sets an upper limit on the resolution of the communicated sensor measurement. Demodulator 230 could be an analog demodulator or a digital demodulator. In digital demodulation the modulated carrier signal is first digitized and then digitally filtered to remove the carrier frequency and recover the signal. Digital demodulation could provide for reduced demodulation error and improved measurement accuracy.

Further processing of $f'_{SIGNAL}$ could occur. For instance, $f'_{SIGNAL}$ might be digitized by an analog-to-digital converter (ADC) for use in a digital control system. Alternately, isolating communication circuit 200 could produce only an analog signal and digitization, if required, could be performed by other components of AC supply 100, such as switch controller 114, for example.

Various modulation and demodulation schemes are possible in accordance with the embodiments herein including amplitude modulation (AM), frequency modulation (FM), or quadrature amplitude modulation (QAM). In the case of AM, analog modulator 206 could be a variable gain amplifier whose gain is determined by voltage of sense signal $f_{SIGNAL}$. Demodulator 230 could be a low pass filter with a cut-off frequency below the carrier frequency but greater than the highest frequency of interest of the sense signal. In one embodiment $f_{SIGNAL}$ is 10 MHz and $f_C$ is 1 GHz.

Figure 2B:
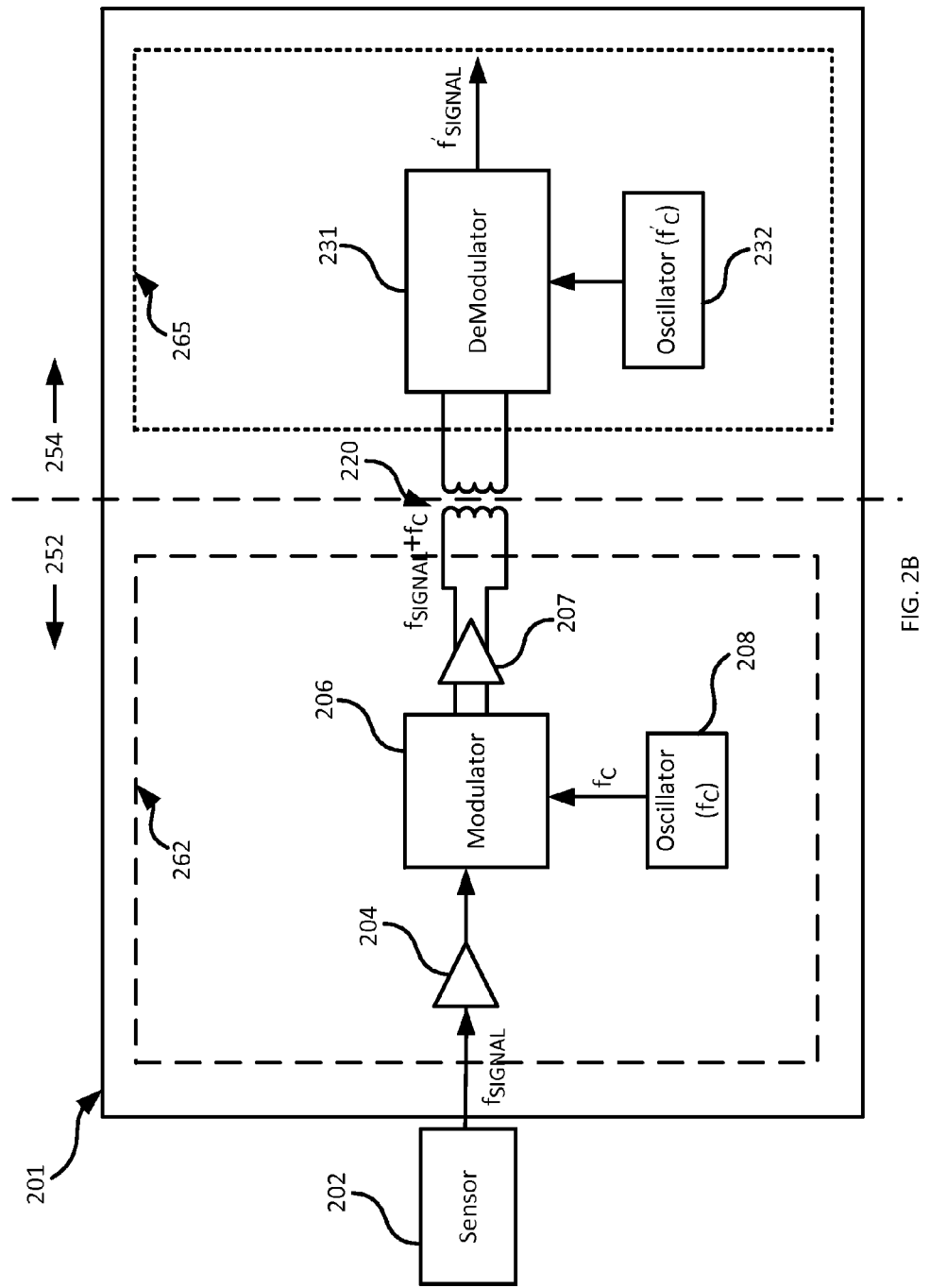
FIG. 2B is a circuit diagram illustrating an isolating communication circuit using a second oscillator to regenerate the carrier signal at the receiver according to an embodiment herein.

While some modulation schemes can be demodulated without regenerating the carrier signal at the receiver, most modulation schemes can benefit from regeneration of the carrier frequency. FIG. 2B, with reference to FIGS. 1 and 2A, is a circuit diagram of an isolating communication circuit 201 using a second oscillator 232 to regenerate the carrier signal at the receiver 265. Isolating communication circuit 201 comprises transmitter 262, receiver 265, and transformer 220. Receiver 265 comprises demodulator 231 and oscillator 232. Oscillator 232 generates a second carrier signal of substantially identical frequency as the carrier signal $f_C$ generated by oscillator 208 in transmitter 262. Demodulator 231 receives the carrier signal $f'_c$ and uses it to demodulate the modulated carrier signal $f_{SIGNAL}+f_C$ received from transmitter 262 through transformer 220. Demodulator 231 could be configured as an analog demodulator or a digital demodulator.

It is preferable that the frequency of the carrier signal generated by oscillator 232 does not differ substantially from the frequency of the carrier signal $f_C$ generated by oscillator 208. The frequency of an oscillator could be dependent on environmental parameters such as, for example, its operating temperature and supply voltage. Frequency mismatch between oscillators 208 and 232 could lead to imperfect demodulation and distortion of the received sense signal, limiting the resolution of the sensor measurement. Moreover, preferably there is no phase difference between the phase of the carrier signals $f_C$ and $f'_c$ generated by oscillators 208, 232, respectively. Certain types of modulation schemes such as, for example, phase modulation (PM), are susceptible to phase differences.

Figure 2C:
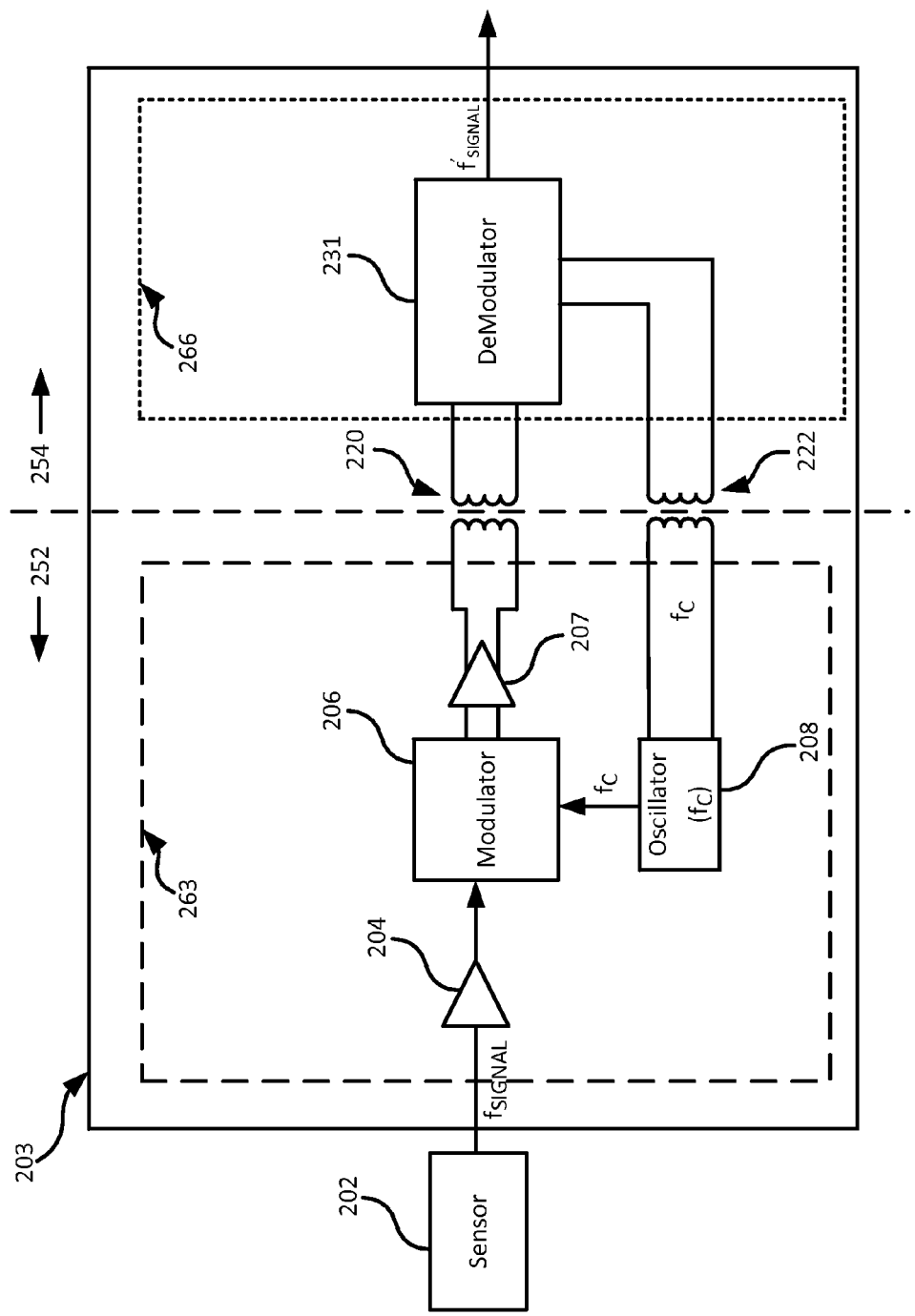
FIG. 2C is a circuit diagram illustrating an isolating communication circuit that does not require a second oscillator according to an embodiment herein.

FIG. 2C, with reference to FIGS. 1 through 2B, is a circuit diagram of an isolating communication circuit 203 that does not require a second oscillator. Isolating communication circuit 203 comprises transmitter 263, receiver 266, and transformers 220, 222. Transmitter 263 comprises analog modulator 206, oscillator 208, power amplifier 207, and AFE 204. Receiver 266 comprises demodulator 231. Transformer 222 comprises two windings and spans high side power domain 252 and low side power domain 254 with a winding in each domain 252, 254. The windings of the transformer 222 are galvanically isolated from one another but are inductively coupled together such that a signal in one winding will induce a signal of similar frequency in the other winding. The voltage of the induced signal depends on the turns ratio and coupling between the windings in the transformer 222. In one embodiment, the turns ratio is 1:1 and the coupling ratio is 0.3. Transformer 222 receives the unmodulated carrier signal $f_C$ generated by oscillator 208 and passes it to demodulator 231.

The unmodulated carrier signal $f_C$ thus passes from high side power domain 252 to low side power domain 254 by passing through transformer 222. Any change in the carrier signal $f_C$ generated by oscillator 208 due to environmental factors that appear at analog modulator 206 also appear at demodulator 231 since they are receiving the same carrier signal $f_C$. Sensor signal distortion from mismatched carrier signals could be reduced by transmitting the unmodulated carrier signal to the receiver 266.

Circuit complexity could also be reduced in the embodiment shown in FIG. 2C. Not only is the oscillator in the receiver eliminated but the transmitter's oscillator design could be significantly simplified. For example, one of the simplest oscillator circuits is a free running oscillator whose oscillation frequency is set by the resonance of on chip passive elements such as a capacitor and an inductor. Although free running oscillators are simple to design their frequency can have a large dependence on operating temperature and the manufacturing process tolerances of the passive components. Communication circuits using free running oscillators to generate carrier signals in the transmitter or receiver could experience significant differences between the two and reduced sense signal resolution. For this reason, more complicated oscillator designs are frequently used, such as for example, one whose frequency is phase locked to a reference crystal oscillator. If the unmodulated carrier signal from the transmitter is transmitted to the receiver however, then a free running oscillator could be used to generate the carrier signal without reduced sense signal resolution.

Figure 2D:
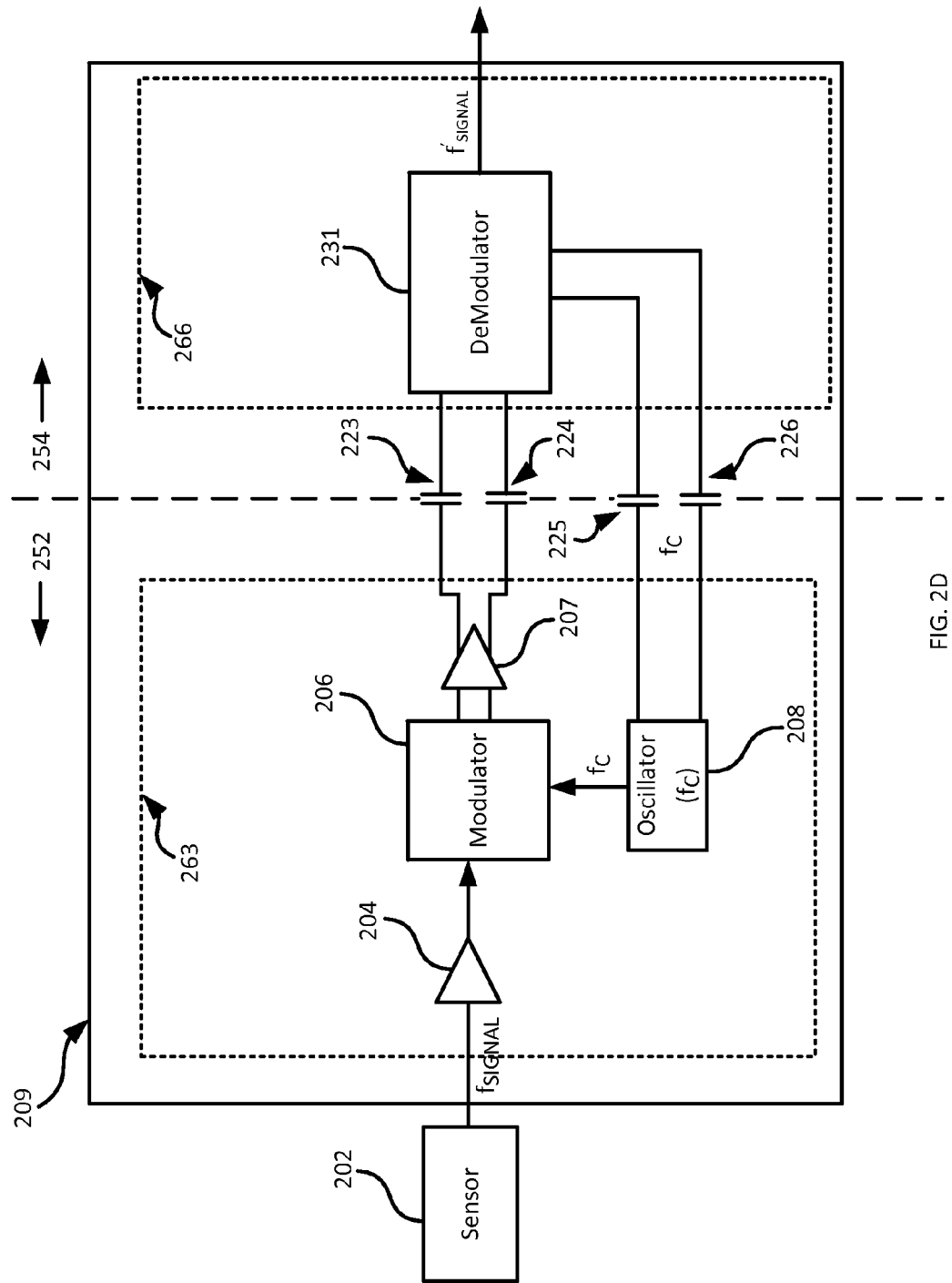
FIG. 2D is a circuit diagram illustrating an isolating communication circuit that uses capacitive coupling to communicate between power domains according to an embodiment herein.

FIG. 2D, with reference to FIGS. 1 through 2C, is a circuit diagram of an isolating communication circuit 209 that uses capacitive coupling to communicate between power domains 252, 254. Capacitive coupling is an alternative to the transformer coupling used in isolating communication circuit 200, 201, 203. Isolating communication circuit 209 comprises transmitter 263, receiver 266, and coupling capacitances 223, 224, 225, and 226. Transmitter 263 comprises analog modulator 206, oscillator 208, power amplifier 207, and AFE 204. Receiver 266 comprises demodulator 231. Capacitances 223, 224, 225, and 226 span high side power domain 252 and low side power domain 254 with one electrode in each domain 252, 254. The electrodes are galvanically isolated from one another but capacitively coupled together such that a voltage applied to one electrode will induce a voltage of similar frequency in the other electrode. In one embodiment capacitance pair 223, 224 have the same capacitance ($C_1$) and capacitance pair 225, 226 have the same capacitance ($C_2$).

Capacitance pair 223, 224 receive the modulated carrier signal generated by modulator 206 and passes it to demodulator 231. Capacitance pair 225, 226 receive the unmodulated carrier signal $f_C$ generated by oscillator 208 and passes it to demodulator 231. Capacitances 223, 224, 225, and 226 should be able to withstand the voltage difference between the power domains that they span without breaking down.

Figure 2E:
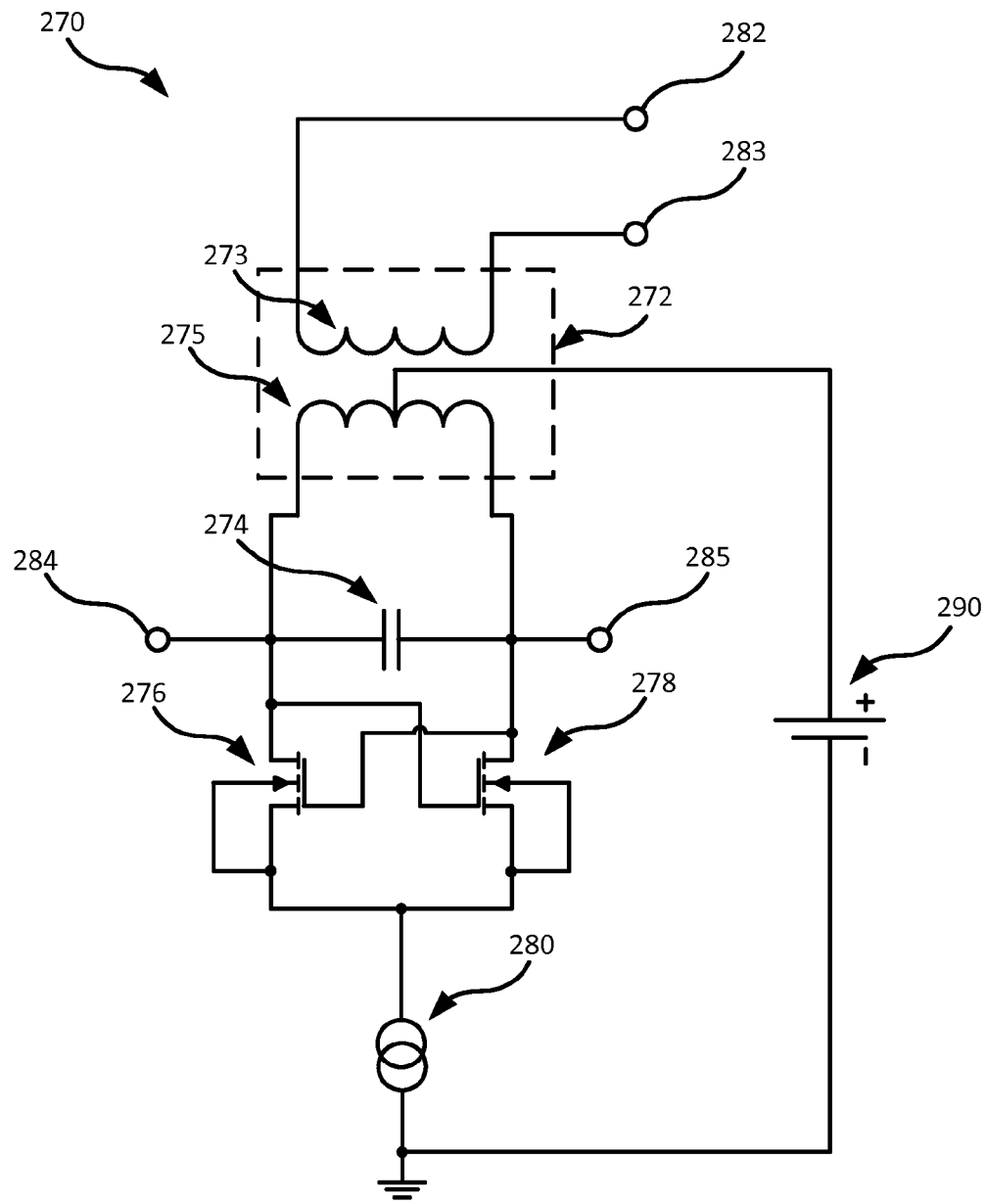
FIG. 2E is circuit diagram illustrating an example of a free running oscillator according to an embodiment herein.

FIG. 2E, with reference to FIGS. 1 through 2D, is circuit diagram of an example of a free running oscillator 270. Oscillator 270 comprises transformer 272, capacitance 274 of capacitance "C", MOSFETS 276, 278, and current source 280. Transformer 272 comprises windings 273, 275 which are galvanically isolated. The frequency (f) of the oscillator 270 is set by the resonant frequency of the parallel combination of capacitance 274 and winding 275 of transformer 272. The resonant frequency is given by the formula:

$$f = \frac{1}{2\pi\sqrt{LC}}$$

where "L" is the inductance of the winding 273 and "C" is the capacitance of capacitance 274. A resonant oscillation at this frequency appears across terminal pair 284, 285 as well as terminal pair 282, 283. Transistors 276, 278 provide amplification of the signal.

An advantage of oscillator 270 is that transformer 272 not only provides the resonant inductance for the parallel LC circuit (capacitance 274 and winding 273) but could also before the role of transformer 222 of FIG. 2C to transmit an unmodulated carrier frequency between transmitter and receiver. Oscillator 270 could thus provide the carrier frequency for the transmitter and receiver. An isolating circuit using oscillator 270 could require less area than designs using a separate resonant inductor and transformer.

Figure 3:
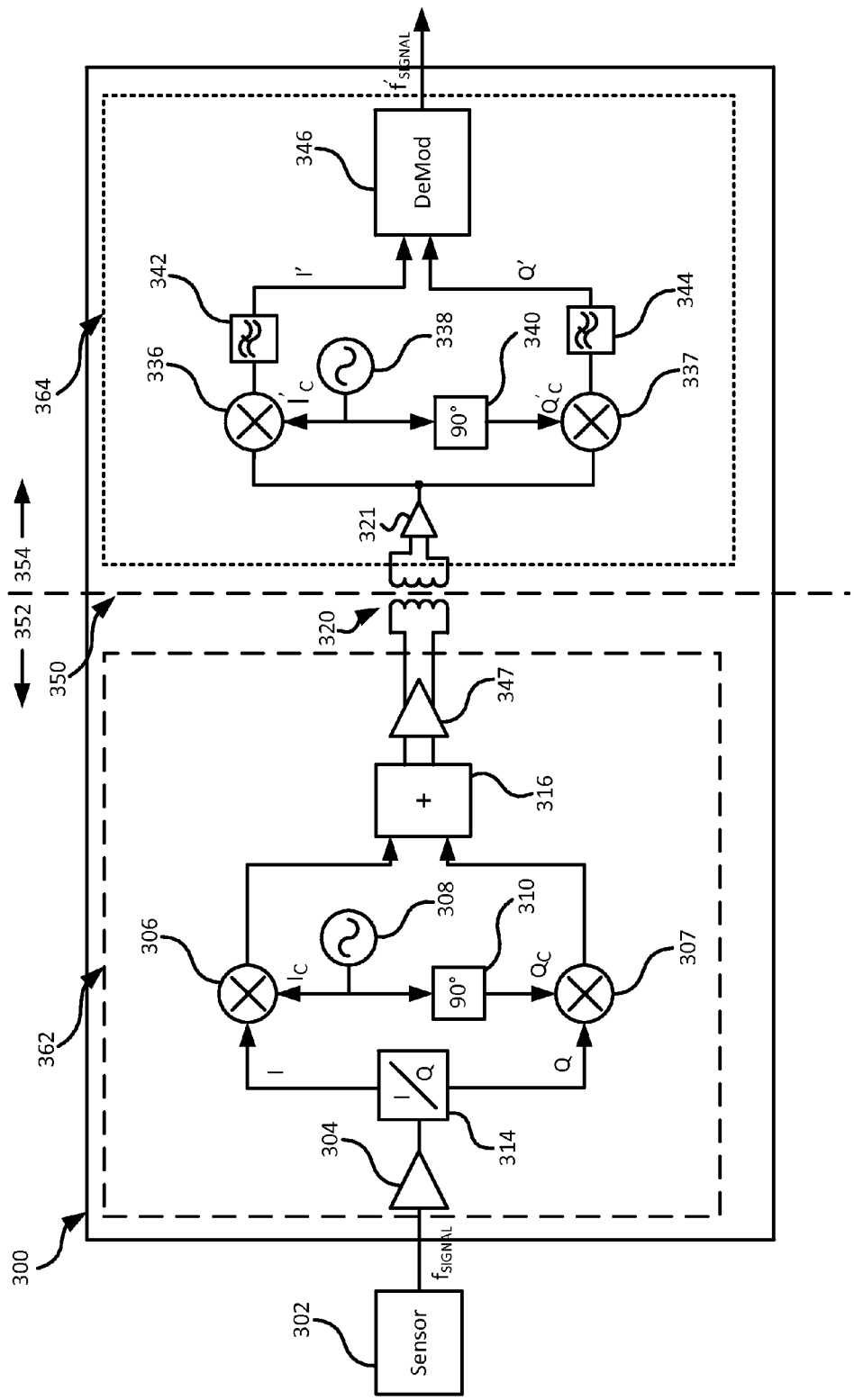
FIG. 3 is a circuit diagram illustrating an isolating communication circuit using I-Q modulation according to an embodiment herein.

FIG. 3, with reference to FIGS. 1 through 2E, is a circuit diagram of an isolating communication circuit 300 using I/Q modulation. I/Q modulation is a general modulation method and may be used to implement a number of different modulation schemes including AM, FM, and PM. Isolating communication circuit 300 comprises transmitter 362, receiver 364, and transformer 320. Transmitter 362 comprises AFE 304, IQ baseband generator 314, mixers 306, 307, summing circuit 316, phase delay 310, oscillator 308, and power amplifier 347. Receiver 364 comprises low noise amplifier (LNA) 321, mixers 336, 337, demodulator 346, phase delay 340, oscillator 338, and low pass filters 342, 344. Transformer 220 comprises two galvanically isolated windings and spans power domains 352, 354 with a winding in each power domain 352, 354.

Sensor 302 outputs analog sensor signal $f_{SIGNAL}$ to AFE 304 which processes the sensor signal $f_{SIGNAL}$ and passes it to IQ baseband generator 314. IQ baseband generator 314 baseband generates in-phase (I) and quadrature (Q) modulation signals. The choice of the IQ generator 314 determines the particular modulation scheme. In some IQ modulation schemes, IQ generator 314 could be unnecessary. The in-phase signal (I) is input to mixer 306 and modulates the amplitude of in-phase carrier signal ($I_C$) generated by oscillator 308. The quadrature phase modulation signal (Q) is input to mixer 307 and modulates the amplitude of a quadrature carrier signal ($Q_C$). Quadrature carrier signal $Q_C$ has a 90 degree phase delay 310 relative to in-phase carrier signal $I_C$. The quadrature carrier signal is generated by passing the in-phase carrier signal from oscillator 308 through phase delay 310. Phase delay 310 creates a phase delay of 90 degrees between its input and its output. Another alternative method of generating I and Q signals is to have an oscillator running at twice the carrier frequency and using a divide by two quadrature divider to generate I and Q signals at $f_C$.

The modulated in-phase and quadrature carrier signals are added at summing circuit 316, amplified by power amplifier 347, and output to transformer 320. Summing circuit 316 performs a simple addition of the two modulated carrier signals. Transformer 320 comprises two windings and spans power domains 352, 354 with a winding in each power domain 352, 354. The windings of the transformer 320 are galvanically isolated but inductively coupled together such that a signal in one winding will induce a signal of similar frequency in the other winding. The voltage of the induced signal depends on the turns ratio and coupling between the windings of the transformer 320. In one embodiment the turns ratio is 1:1 and the coupling ratio is 0.3. The summed modulated carrier signal passes through transformer 320, low noise amplifier 321, and into mixers 336, 337. Mixer 336 adds the summed modulated carrier signal and a carrier signal $I_L$ generated by oscillator 338. Mixer 337 adds the summed modulated carrier signal and a quadrature carrier signal $Q'_C$ generated by phase shifter 340. The outputs of mixers 336, 337 are filtered by low pass filters 342, 344 respectively. Filters 342, 344 have cut-off frequencies above the maximum sensor frequency of interest but below twice the carrier frequency. Filters 342, 344 remove the double frequency carrier signal and output recovered versions of the in-phase and quadrature modulation signals I' and Q', respectively.

Recovered in-phase and quadrature modulation signals I' and Q' are demodulated by demodulator 346 which generates a recovered version of original sensor signal $f'_{SIGNAL}$. Demodulator 346 could be an analog or a digital demodulator. In digital demodulation the modulated carrier signal is first digitized and then digitally filtered to remove the carrier frequency and recover the signal. Digital demodulation could reduce the demodulation error and improve the measurement accuracy. Preferably, the frequency of the carrier signal from oscillator 338 does not substantially differ from the frequency of the carrier signal generated by oscillator 308 so as not to lead to imperfect demodulation and distortion of the received sense signal, which could limit the accuracy of the sensor measurement.

Figure 4:
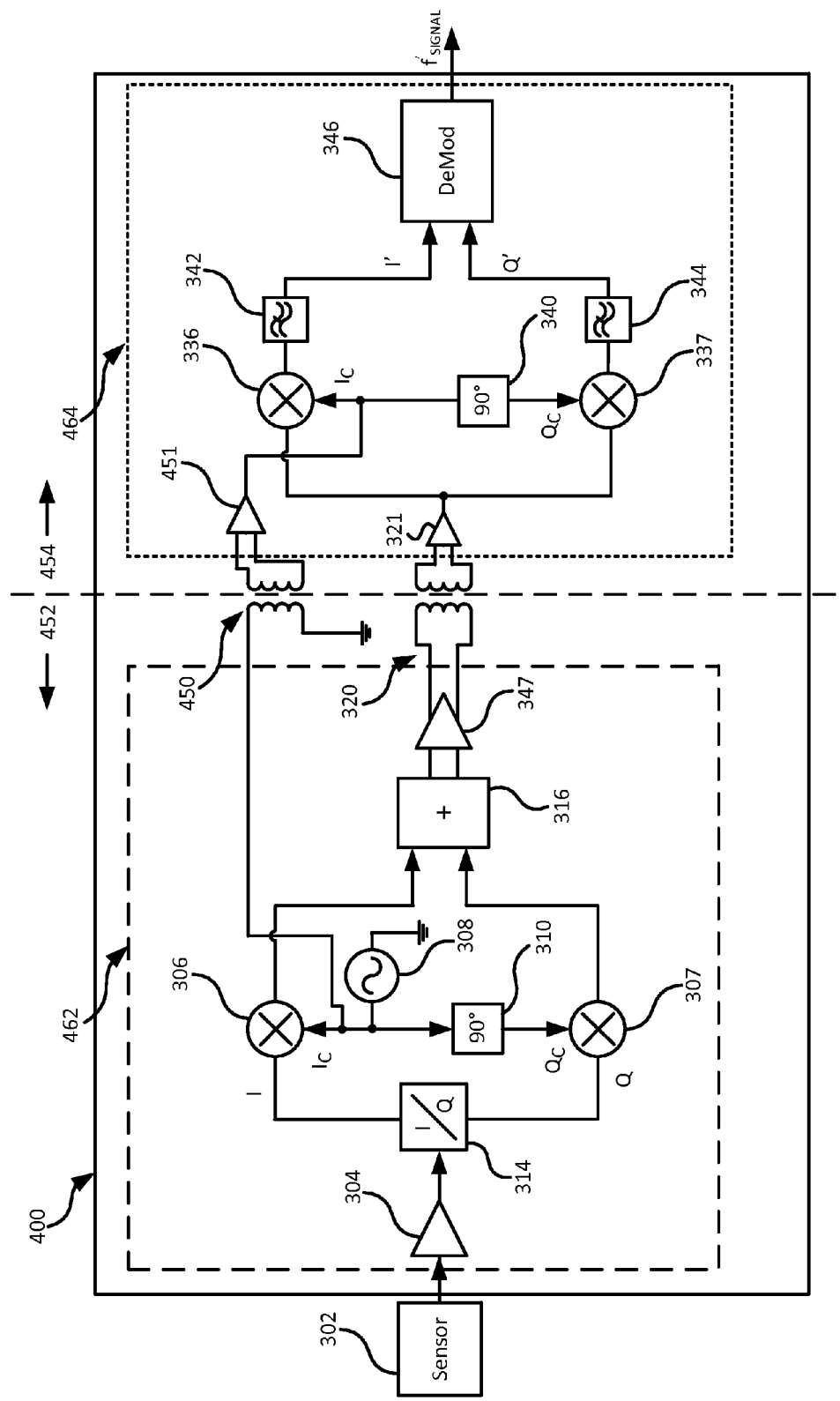
FIG. 4 is a circuit diagram illustrating an isolating communication circuit using I-Q modulation that does not require an oscillator in the receiver according to an embodiment herein.

FIG. 4, with reference to FIGS. 1 through 3, is a circuit diagram of an isolating communication circuit 400 using I/Q modulation that does not require an oscillator in the receiver 464. Isolating communication circuit 400 comprises transmitter, 462, receiver 464, and transformers 320, 450. Transmitter 462 comprises AFE 304, IQ baseband generator 314, mixers 306, 307, summing circuit 316, phase delay 310, oscillator 308, and power amplifier 347. Receiver 464 comprises low noise amplifiers 321, 451, mixers 336, 337, demodulator 346, phase delay 340, and low pass filters 342, 344. Transformers 320, 450 each comprise two galvanically isolated windings and spans power domains 452, 454 with a winding of each transformer 320, 450 in each power domain 452, 454.

Transformer 450 receives the unmodulated, in-phase carrier signal $I_C$ from oscillator 308 and passes it through low noise amplifier 451 to mixer 336. The windings of the transformer 320, 450 are galvanically isolated from one another but are inductively coupled together such that a signal in one winding will induce a signal of similar frequency in the other winding. The voltage of the induced signal depends on the turns ratio and coupling between the windings of transformer 450. In one embodiment the turns ratio is 1:1. The unmodulated, in-phase carrier signal thus passes from power domain 452 to power domain 454.

Mixer 336 adds the unmodulated in-phase carrier signal to the summed modulated carrier signal as output by transformer 320 and low noise amplifier 321. Transformer 450 also passes the in-phase carrier signal to phase delay 340 which generates the quadrature carrier signal for input into mixer 337. Mixer 337 adds the quadrature carrier signal generated by phase shifter 340 to the summed modulated carrier signal as output by transformer 320 and low noise amplifier 321. The outputs of mixers 336, 337 are filtered by low pass filters 342, 344 respectively. Filters 342, 344 have cut-off frequencies above the maximum sensor frequency of interest but below twice the carrier frequency. Filters 342, 344 remove the double frequency carrier signal generated by the mixing operation and output recovered versions of the in-phase and quadrature modulation signals I' and Q', respectively. Recovered in-phase and quadrature modulation signals I' and Q' are processed by demodulator 346, which generates a recovered version of the original sensor signal $f'_{SIGNAL}$. In this embodiment, any changes in the carrier signal generated by oscillator 308 due to environmental factors that appear at mixers 306, 307 also appear at mixers 336, 337. Sense signal distortion from mismatched carrier signals could be reduced in this embodiment. Circuit complexity is also reduced from the elimination of a second oscillator in this embodiment.

Figure 5:
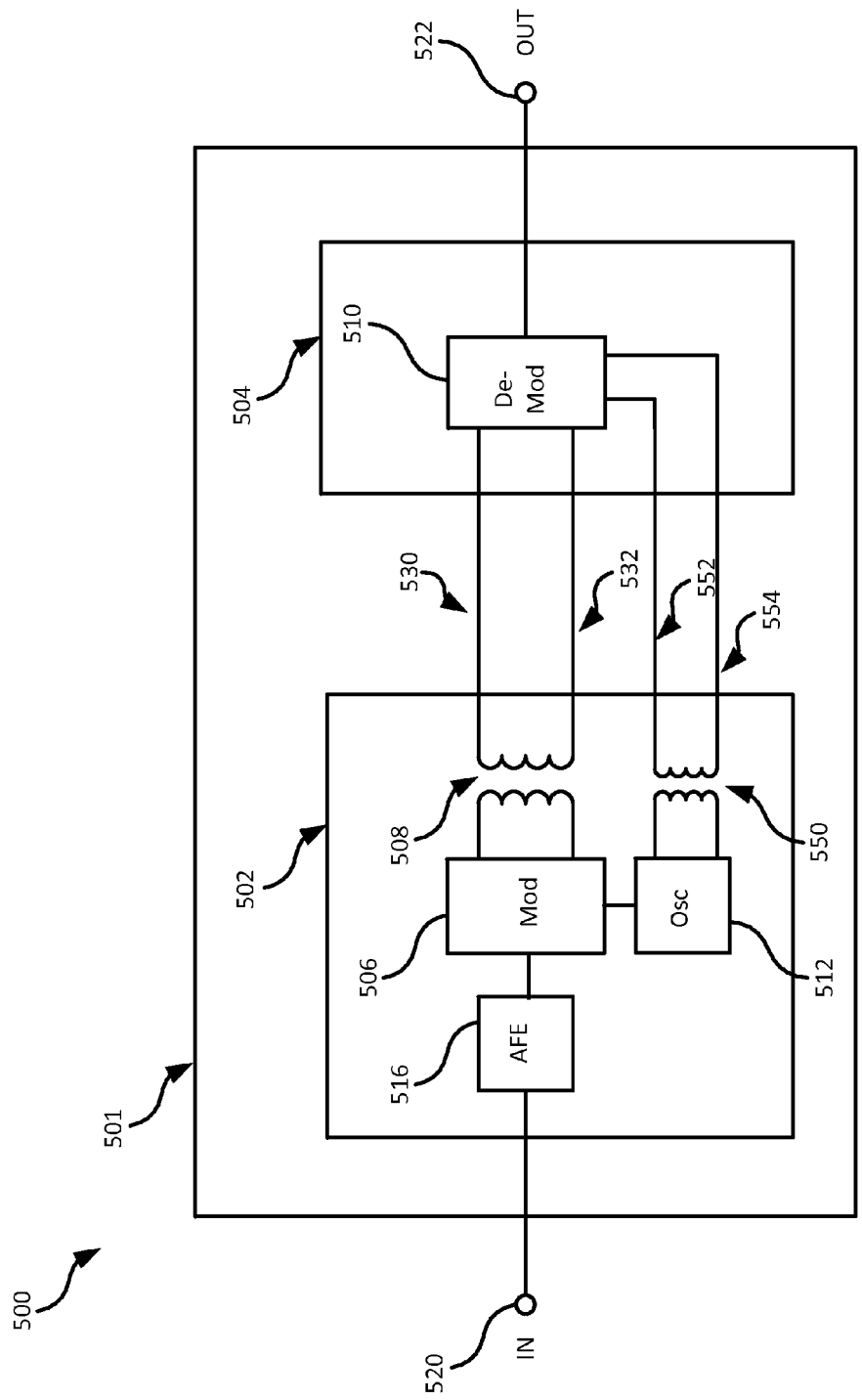
FIG. 5. is a circuit diagram illustrating an example physical embodiment of an isolating communication circuit according to an embodiment herein.

FIG. 5, with reference to FIGS. 1 through 4, is a circuit diagram of an example physical embodiment of an isolating communication circuit 500. Isolating communication circuit 500 comprises semiconductor die 502, 504 packaged into multi-chip package 501. Die 502 comprises analog modulator 506, oscillator 512, AFE 516, and on-chip transformers 508, 550. Die 504 comprises demodulator 510 which could be an analog or digital demodulator. Die 502 and die 504 are galvanically isolated by the packaging material of package 501 and the isolation material between the windings of transformers 508, 550. Package 501 could be a plastic package and die 502, 504 could be supported in package 501 by separate metal die "paddles". Package 501 could also be a ceramic package in which case no die paddle is necessary. The windings of transformers 508, 550 could be the intermetal dielectric layers of die 502 or it could be an additional conformal die coating such as a polyimide die overcoat. Sensor data arrives at input pin 520 and is output at output pin 522.

Connectors 530, 532 connect one winding of transformer 508 to demodulator 510 and carry the modulated carrier signal. Connectors 552, 554 connect one winding of transformer 550 to demodulator 510 and carry the unmodulated carrier signal. Connectors 530, 532, 552, and 554 may be implemented using any of various known multi-chip packaging connection methods including: bond wires, a redistribution layer, lead on chip (LOC) technology, or an interposer. Die 502, 504 might also use chip on board (COB) technology and be flip mounted onto a printed circuit board using ball bumps. Although transformers 508, 550 in FIG. 5 are shown as implemented in die 502, in another embodiment the transformers 508, 550 could be implemented on die 504.

The isolating communication circuit 500 could also be implemented in a single semiconductor die with sufficient insulating properties to meet the isolation requirements of the power domains that it communicates between. In one embodiment the semiconductor die uses semiconductor on insulator (SOI) technology in which dielectric isolation is used to isolate power domains. Transformers 508, 550 could be implemented in the metallization layers of die 502. They could also be implemented in a redistribution layer formed after manufacture of die 502 as part of the packaging process.

Figure 6A:
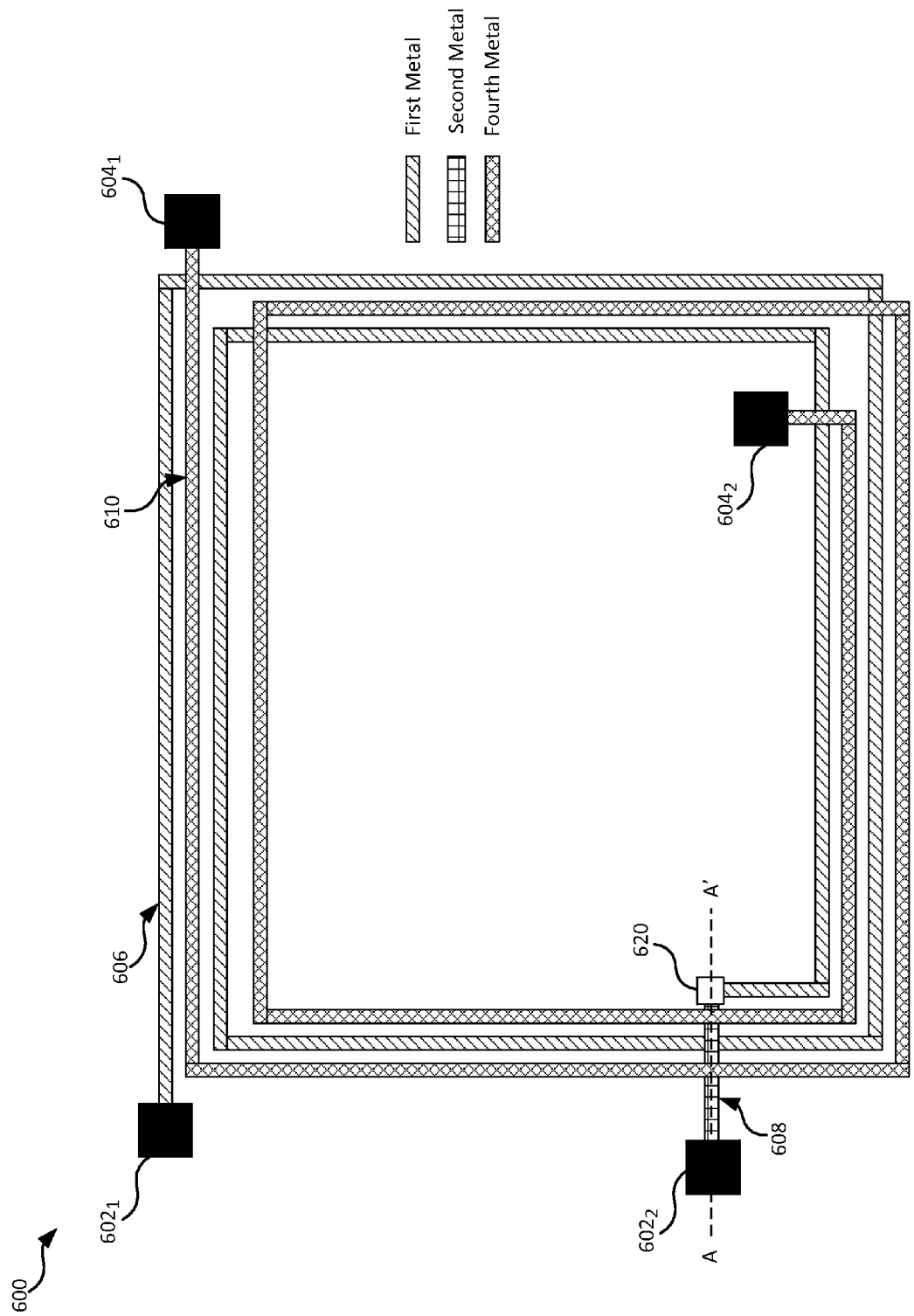
FIG. 6A is a plan view illustrating an on-chip transformer implemented in the die metalization layers according to an embodiment herein.
Figure 6B:
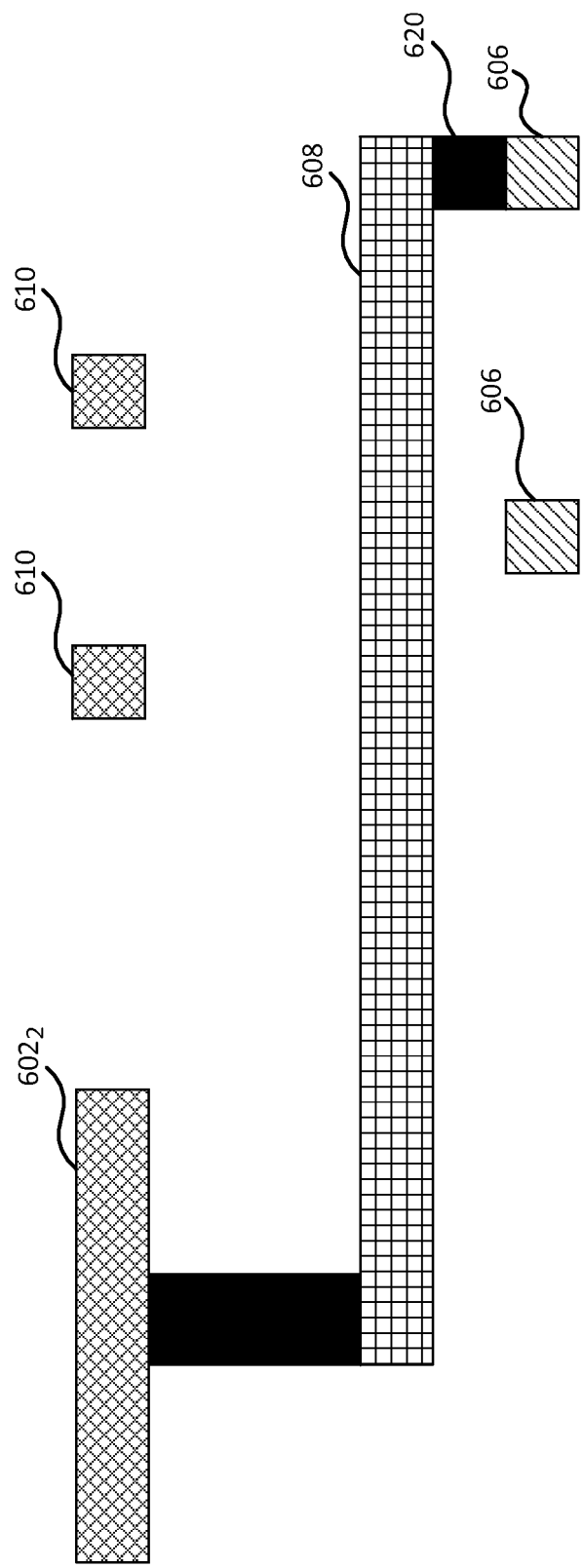
FIG. 6B is a cross-sectional drawing of the on-chip transformer of FIG. 6A taken along line A-A' of FIG. 6A according to an embodiment herein.

FIG. 6A, with reference to FIGS. 1 through 5, is a plan view of an on-chip transformer 600 implemented in the die metallization layers. Planar transformer 600 includes first terminal pair $602_1$, $602_2$, second terminal pair $604_1$, $604_2$, spirals 606, 610, via 620, and underpass 608. FIG. 6B, with reference to FIGS. 1 through 6A, is a cross-sectional view of the on-chip transformer 600 of FIG. 6A taken along line A-A' of FIG. 6A. Transformer 600 comprises a first winding and a second winding. Terminal $602_1$ connects to spiral 606 to begin the first winding. First spiral 606 connects to underpass 608 through via 620. Underpass 608 connects to terminal $602_2$ to complete the first winding. Terminals $604_1$, $604_2$ connect to opposing ends of second spiral 610 to form the second winding. In one embodiment, spiral 606 and underpass 608 are fabricated in the first and second metal layers of the semiconductor die, respectively, and spiral 610 is fabricated in the uppermost metal layer of the die. In this embodiment the vertical spacing between windings is maximized which could improve the breakdown voltage between windings.

Figure 7:
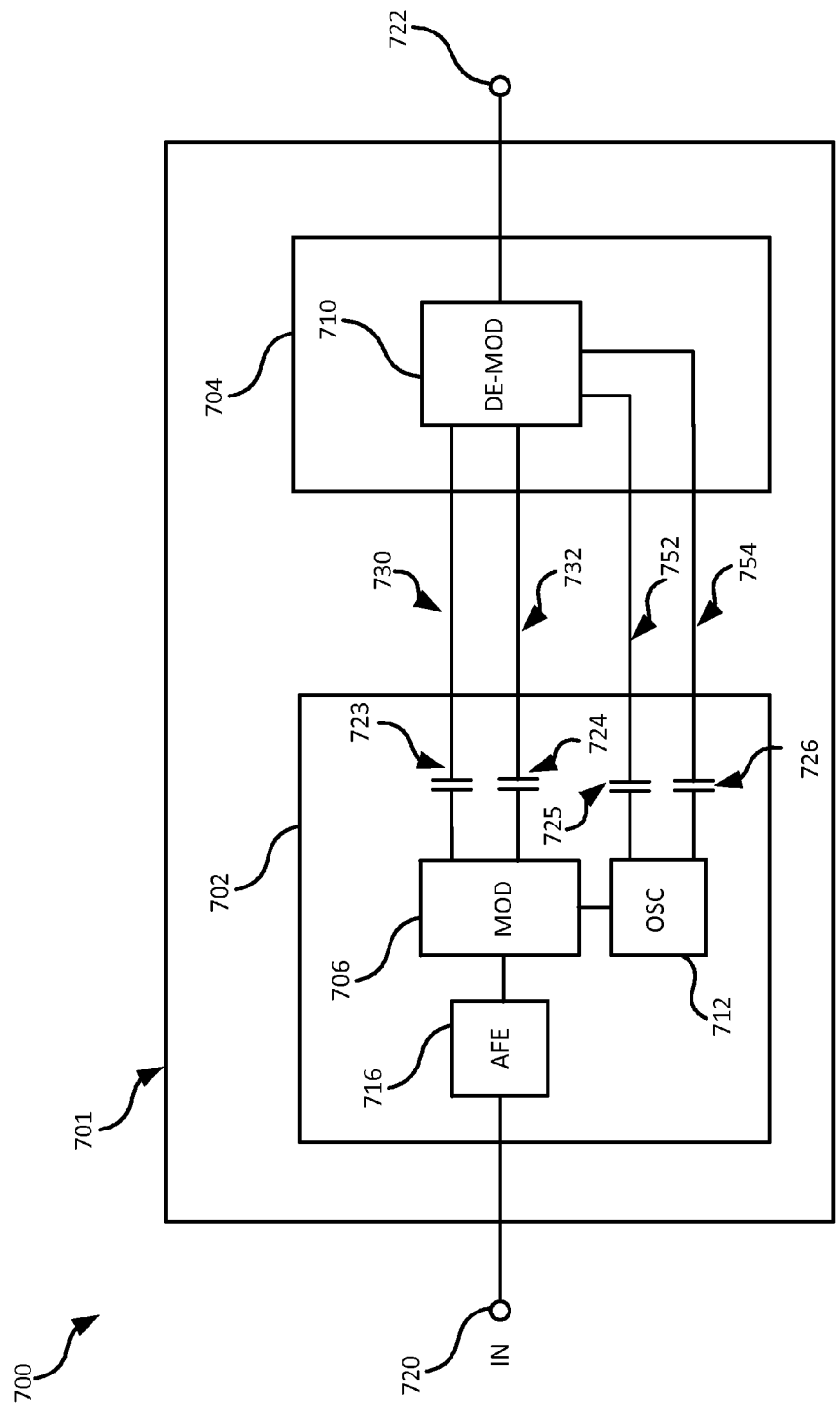
FIG. 7. is a circuit diagram of an example physical embodiment of another isolating communication circuit according to an embodiment herein.

FIG. 7, with reference to FIGS. 1 through 6B, is a circuit diagram of an example physical embodiment of another isolating communication circuit 700. Isolating communication circuit 700 comprises semiconductor die 702, 704 packaged into multi-chip package 701. Die 702 comprises analog modulator 706, oscillator 712, AFE 716, and on-chip capacitors 723, 724, 725, and 726. Die 704 comprises demodulator 710 which could be an analog or digital demodulator. Die 702 and die 704 are galvanically isolated by the packaging material of package 701 and the isolation material between the electrodes of capacitors 723, 724, 725, 726. Package 701 could be a plastic package and die 702, 704 could be supported in package 701 by separate metal die "paddles". Package 701 could also be a ceramic package in which case no die paddle is necessary. The capacitor dielectric of capacitors 723, 724, 725, and 726 could be the intermetal dielectric layers of die 702 or it could be an additional conformal die coating such as a polyimide die overcoat. Sensor data arrives at input pin 720 and is output at output pin 722.

Connectors 730, 732 connect capacitors 723, 724, respectively, to demodulator 710 and carry the modulated carrier signal. Connectors 752, 754 connect capacitor 725, 726, respectively, to demodulator 710 and carry the unmodulated carrier signal. Connectors 730, 732, 752, and 754 may be implemented using any of various known multi-chip packaging connection methods including: bond wires, a redistribution layer, LOC technology, or an interposer. Die 702, 704 may also use COB technology and be flip mounted onto a printed circuit board using ball bumps. Although capacitors 723, 724, 725, 726 in FIG. 7 are shown as implemented on die 702, in another embodiment they could be implemented on die 704.

In another embodiment the isolating communication circuit 700 is implemented in a single semiconductor die with sufficient insulating properties to meet the isolation requirements of the power domains that it communicates between. In one embodiment the semiconductor die uses SOI technology in which dielectric isolation is used to isolate power domains. Capacitors 723, 724, 725, and 726 could be implemented in the metallization layers of die 702. They could also be implemented in a redistribution layer formed after manufacture of die 702 as part of the packaging process.

Figure 8:
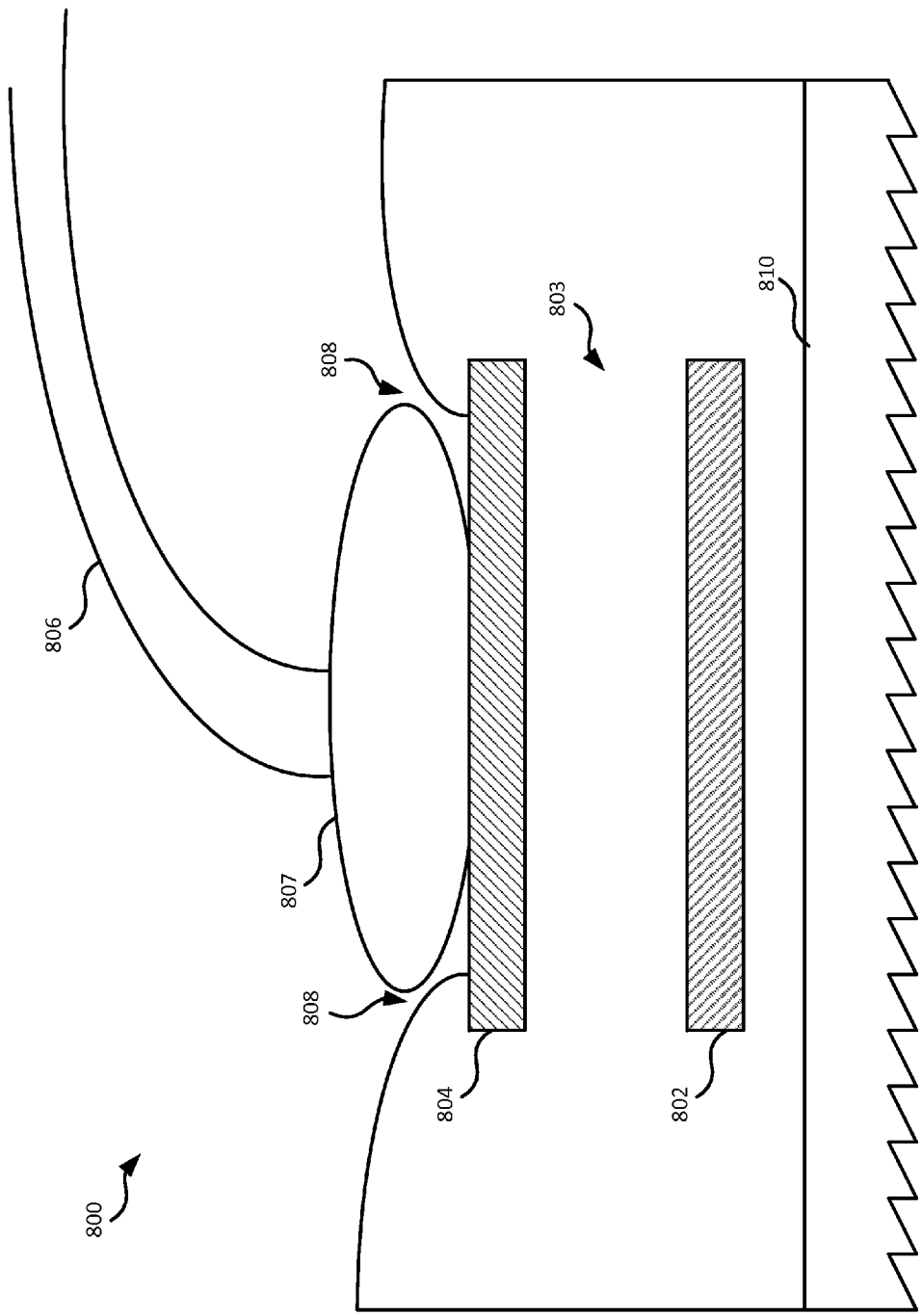
FIG. 8 is a cross-sectional diagram illustrating an example on-chip capacitor implemented in the semiconductor die metalization layers according to an embodiment herein.

FIG. 8, with reference to FIGS. 1 through 7, is a cross-sectional diagram of an example on-chip capacitor 800 implemented in the semiconductor die metallization layers. FIG. 8 is for illustrative purposes and is not to scale. Planar capacitor 800 comprises bottom electrode 802, capacitor dielectric 803 and top electrode 804. Planar capacitor 800 sits above semiconductor substrate 810 and could be isolated from the substrate by, for example, a field oxide layer or a deposited insulated layer. Wire bond 806 contacts top electrode 804 through ball bond 807 and opening 808 and could connect to another power domain. Bottom electrode 802 and top electrode 804 could be fabricated in the first and top metal layers of the semiconductor die, respectively, the capacitor dielectric could be fabricated from the intermetal dielectric layers of the semiconductor die and opening 808 could be formed using the bond pad opening process of the semiconductor die. Alternatively, bottom electrode 802 could be fabricated from a doped polysilicon layer or a doped diffused portion of the semiconductor substrate.

Capacitor 800 is only one example of an on-chip capacitor and other implementations are possible. For example, the bottom electrode 802 of the capacitor 800 could be fabricated from the semiconductor die's top metal, the capacitor dielectric 803 could be fabricated from a die overcoat layer such as a polyimide layer, and the top electrode 804 could be fabricated from an additional metal layer such as a redistribution layer.

Isolating circuits 200, 201, 203, 209, 300, 400, 500, and 700 use analog modulation of their carrier signals to encode information about the sensor signal. In analog modulation the property of the carrier signal (e.g., amplitude, frequency, and phase) is modulated by the sensor signal in a continuous manner based on the amplitude of the sensor signal.

An alternative approach is digital modulation of the carrier signal. In digital modulation the sensor signal is first converted to digital form by digitizing it at a particular sampling frequency and resolution (number of bits). The digital signal is then used to modulate the carrier signal's properties in a discrete and non-continuous manner based on the digital bitstream. For example, U.S. Pat. No. 7,421,028 describes a transformer isolated interchip communication scheme using the digital modulation methods of Frequency Shift Keying and Amplitude Shift Keying.

Analog modulation could have advantages over digital modulation for an isolating communication circuit in terms of simplicity of the circuit design. For example, in AC power supply 100 of FIG. 1 digital modulation requires digitization of the sensor signal in the high side power domain using an analog-to-digital converter (ADC). For accurate and low noise digitization at high bandwidth the clock signal of the ADC should be stable. Any instability in the clock such as phase noise will add noise to the signal and decrease the resolution of the measurement. This could require the use of a phase locked loop circuit referenced to a crystal oscillator which could add cost and complexity to the design. In the case of I/Q digital modulation, two ADCs could be required to digitize both the I and Q signals.

An ADC in the low side power domain of AC power supply 100, on the other hand, could reference itself to an existing clock reference, such as the clock reference of controller 114. This could add less cost and complexity than a high side ADC. Analog demodulation could therefore be less costly and complex to implement than digital modulation.

Digital modulation could also require additional control signals to pass between the transmitter and receiver to enable digital communication which could require their own isolated communication channels and increase complexity and cost. Digital modulation could require a higher communication bandwidth than analog communication. For example, a popular digitization approach uses an oversampled delta sigma ($\Delta\Sigma$) ADC. An oversampled $\Delta\Sigma$ ADC digitizes the signal with only one bit of resolution but at a much higher sampling frequency than the minimum required sampling frequency (commonly referred to as the Nyquist frequency). For example, if the highest frequency of interest in the sensor signal is 1.0 MHz then the Nyquist frequency is 2.0 MHz and an oversampled $\Delta\Sigma$ ADC might require a sampling frequency of 64 times the Nyquist or 128 MHz. The bandwidth requirements of the transmitter and receiver could be significantly higher than for an analog modulation scheme.

A digital modulation scheme could require greater circuitry complexity including clock recovery circuitry in the receiver to recover the digital clock or a digital-to-analog converter (DAC) in the receiver to convert the digitized version of the sensor signal back to a more universally compatible analog signal for use by other components of the system, such as for example, a mixed signal microcontroller.

Figure 9:
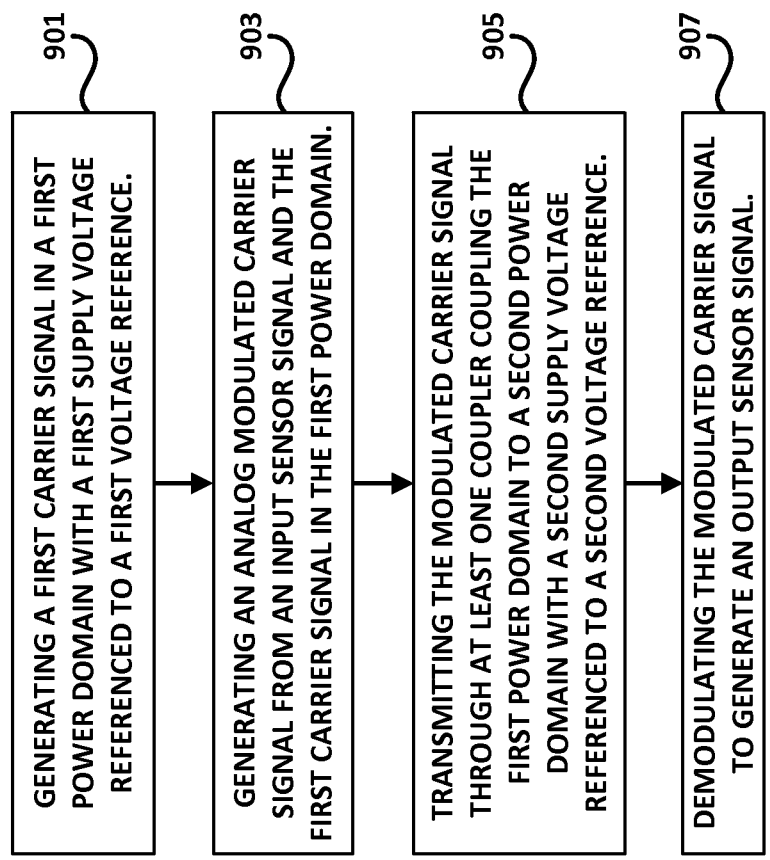
FIG. 9 is a flow diagram illustrating a method according to an embodiment herein.

FIG. 9, with reference to FIGS. 1 through 8, is a flow diagram illustrating a method of sending signals between power domains (e.g., 252, 254; 352, 354; 452, 454) according to an embodiment herein. The method comprises generating (901) a first carrier signal $f_C$ in a first power domain (e.g., 252; 352; 452) with a first supply voltage referenced to a first voltage reference; generating (903) an analog modulated carrier signal ($f_{SIGNAL}+f_C$) from an input sensor signal $f_{SIGNAL}$ and the first carrier signal $f_C$ in the first power domain (e.g., 252; 352; 452); transmitting (905) the modulated carrier signal ($f_{SIGNAL}+f_C$) through at least one coupler (e.g., 220; 223-226; 320; 450) coupling the first power domain (e.g., 252; 352; 452) to a second power domain (e.g., 254; 354; 454) with a second supply voltage referenced to a second voltage reference, wherein the second voltage reference is different from the first voltage reference, and wherein the at least one coupler (e.g., 220; 223-226; 320; 450) comprises a pair of galvanically isolated elements (e.g., 273, 275; 508, 550) with one galvanically isolated element in each of the first power domain (e.g., 252; 352; 452) and the second power domain (e.g., 254; 354; 454); and demodulating (907) the modulated carrier signal to generate an output sensor signal $f'_{SIGNAL}$. The method may further comprise inductively coupling together the pair of galvanically isolated elements (e.g., 273, 275; 508, 550). The method may further comprise providing a plurality of couplers (e.g., 220; 223-226; 320; 450) each comprising a pair of galvanically isolated elements (e.g., 273, 275; 508, 550) with one galvanically isolated element of each coupler in each of the first power domain (e.g., 252; 352; 452) and the second power domain (e.g., 254; 354; 454). The method may further comprise transmitting an unmodulated carrier signal $f_C$ from the first power domain (e.g., 252; 352; 452) to the second power domain (e.g., 254; 354; 454) through at least one of the plurality of couplers (e.g., 220; 223-226; 320; 450).

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. An electrical circuit comprising:
    a transmitter in a first power domain with a first supply voltage referenced to a first voltage reference, said transmitter comprising:
        a first oscillator generating a first carrier signal; and
        an analog modulator receiving an input sensor signal and said first carrier signal and generating a modulated carrier signal;
    a receiver in a second power domain with a second supply voltage referenced to a second voltage reference, wherein said second voltage reference is different from said first voltage reference, wherein said receiver comprises a demodulator that receives and demodulates said modulated carrier signal and generates an output sensor signal; and
    at least one coupler comprising a pair of galvanically isolated elements with one galvanically isolated element in each of said first power domain and said second power domain, wherein said modulated carrier signal couples from said first power domain to said second power domain through said at least one coupler.

2. The electrical circuit of claim 1, wherein said demodulator receives a second carrier signal.

3. The electrical circuit of claim 1, further comprising a sensor that takes measurements and generates said input sensor signal.

4. The electrical circuit of claim 1, wherein said first oscillator comprises a free running oscillator.

5. The electrical circuit of claim 1, wherein said pair of galvanically isolated elements are inductively coupled together.

6. The electrical circuit of claim 1, wherein said pair of galvanically isolated elements are capacitively coupled together.

7. The electrical circuit of claim 1, wherein said demodulator comprises an analog demodulator.

8. The electrical circuit of claim 1, wherein said demodulator comprises a digital demodulator.

9. The electrical circuit of claim 1, wherein said at least one coupler comprises a transformer.

10. The electrical circuit of claim 1, wherein said at least one coupler comprises a capacitor.

11. The electrical circuit of claim 2, further comprising a second oscillator in said receiver that generates said second carrier signal.

12. The electrical circuit of claim 1, further comprising a second coupler comprising a second pair of galvanically isolated elements with one galvanically isolated element of said second coupler in each of said first power domain and said second power domain, wherein said first carrier signal passes from said first power domain to said second power domain through said second coupler unmodulated.

13. The electrical circuit of claim 1, wherein said first oscillator comprises one of said galvanically isolated elements of said at least one coupler.

14. The electrical circuit of claim 1, wherein said electrical circuit comprises a single electronic package, said transmitter comprises a first semiconductor die, and said receiver comprises a second semiconductor die.

15. An electrical circuit comprising:
    a transmitter in a first power domain with a first supply voltage referenced to a first voltage reference, said transmitter providing a modulated carrier signal and an unmodulated carrier signal;
    a receiver in a second power domain with a second supply voltage referenced to a second voltage reference, wherein said second voltage reference is different from said first voltage reference, wherein said receiver comprises a demodulator that receives and demodulates said modulated carrier signal and generates an output sensor signal; and
    at least one coupler comprising a pair of galvanically isolated elements with one galvanically isolated element in each of said first power domain and said second power domain, wherein said modulated carrier signal couples from said first power domain to said second power domain through said at least one coupler.

16. The electrical circuit of claim 15, wherein said transmitter comprises:
- an oscillator that generates a first unmodulated carrier signal;
- a phase delay element that generates a second unmodulated carrier signal;
- a baseband generator that generates modulation signals;
- a first mixer that adds a first modulation signal from said baseband generator to said first unmodulated carrier signal to create a first modulated carrier signal;
- a second mixer that adds a second modulation signal from said baseband generator to said second unmodulated carrier signal to create a second modulated carrier signal; and
- a summing circuit that sums said first modulated carrier signal with said second modulated carrier signal to generate said modulated carrier signal that couples through said at least one coupler.

17. The electrical circuit of claim 16, wherein said modulation signals comprise in-phase and quadrature phase modulation signals.

18. The electrical circuit of claim 16, wherein said receiver comprises:
- an oscillator that generates an in-phase carrier signal;
- a phase delay element that generates a quadrature phase carrier signal;
- a first mixer that adds said modulated carrier signal with said in-phase carrier signal;
- a second mixer that adds said modulated carrier signal with said quadrature phase carrier signal;
- a first filter that filters an output of said first mixer; and
- a second filter that filters an output of said second mixer,
- wherein said first filter and said second filter output a recovered version of said first modulation signal and said second modulation signal for input into said demodulator.

19. The electrical circuit of claim 15, further comprising a second coupler comprising a second pair of galvanically isolated elements with one galvanically isolated element in each of said first power domain and said second power domain, wherein said unmodulated carrier signal couples from said first power domain to said second power domain through said second coupler.

20. The electrical circuit of claim 19, wherein said receiver comprises:
- a first mixer that adds said unmodulated carrier signal with said modulated carrier signal; and
- a phase delay element that receives said unmodulated carrier signal and generates a quadrature phase unmodulated carrier signal;
- a second mixer that adds said quadrature phase unmodulated carrier signal with said modulated carrier signal;
- a first filter that filters an output of said first mixer; and
- a second filter that filters an output of said second mixer,
- wherein said first filter and said second filter output a recovered version of a first and second modulation signal for input into said demodulator.

21. A method of sending signals between power domains, said method comprising:
- generating a first carrier signal in a first power domain with a first supply voltage referenced to a first voltage reference;
- generating an analog modulated carrier signal from an input sensor signal and said first carrier signal in said first power domain;
- transmitting said modulated carrier signal through at least one coupler coupling said first power domain to a second power domain with a second supply voltage referenced to a second voltage reference, wherein said second voltage reference is different from said first voltage reference, and wherein said at least one coupler comprises a pair of galvanically isolated elements with one galvanically isolated element in each of said first power domain and said second power domain; and
- demodulating said modulated carrier signal to generate an output sensor signal.

22. The method of claim 21, further comprising inductively coupling together said pair of galvanically isolated elements.

23. The method of claim 21, further comprising:
- providing a plurality of couplers each comprising a pair of galvanically isolated elements with one galvanically isolated element of each coupler in each of said first power domain and said second power domain; and
- transmitting an unmodulated carrier signal from said first power domain to said second power domain through at least one of said plurality of couplers.

* * * * *